United States Patent [19]
Salminen

[11] 3,916,514
[45] Nov. 4, 1975

[54] METHOD OF PRODUCING PRINTED CIRCUIT CARDS IN THE FORM OF MULTILAYER PRINTS

[76] Inventor: Aarne Salminen, Elmevaenget 23, 2880 Bagsvaerd, Denmark

[22] Filed: July 2, 1973

[21] Appl. No.: 375,858

[30] Foreign Application Priority Data

July 3, 1972 Denmark ............................ 3308/72

[52] U.S. Cl. ............... 29/625; 174/68.5; 317/101 B; 317/101 C; 317/101 CE; 317/101 CM

[51] Int. Cl.$^{2}$ ............................................ H05K 3/00

[58] Field of Search ....................... 174/68.5; 29/625; 317/101 B, 101 C, 101 CC, 101 CM, 101 CE, 101 D, 101 R

[56] References Cited

UNITED STATES PATENTS

| | | | |
|---|---|---|---|
| 2,864,156 | 12/1958 | Cardy | 29/625 |
| 3,272,909 | 9/1966 | Bruck et al. | 29/625 X |
| 3,344,515 | 10/1967 | Schuster et al. | 174/68.5 X |
| 3,409,732 | 11/1968 | Dahlgren et al. | 29/625 X |
| 3,428,954 | 2/1969 | David | 174/68.5 X |
| 3,433,888 | 3/1969 | Tally et al. | 174/68.5 |
| 3,564,114 | 2/1971 | Blinder | 174/68.5 |

*Primary Examiner*—C. W. Lanham
*Assistant Examiner*—Joseph A. Walkowski
*Attorney, Agent, or Firm*—Haseltine, Lake & Waters

[57] ABSTRACT

A method of producing printed circuit cards in the form of multilayer prints. The method involves simplified steps of planning the wiring pattern by simultaneous planning of wiring patterns in at least three mutually insulated layers.

1 Claim, 4 Drawing Figures

METHOD OF PRODUCING PRINTED CIRCUIT CARDS IN THE FORM OF MULTILAYER PRINTS

Figure 1:
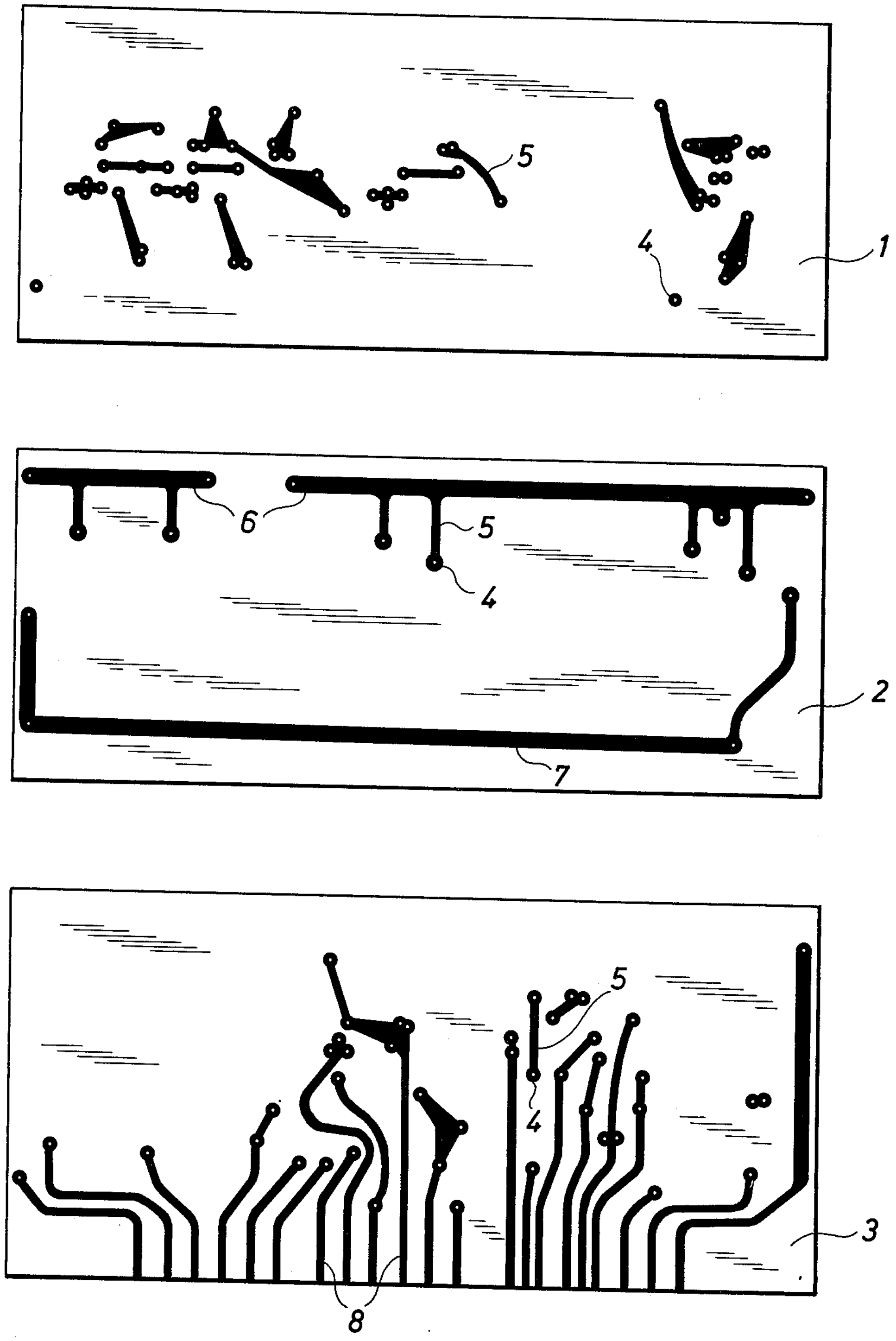

The present invention relates to a method of producing printed circuit cards in the form of multilayer prints.

Printed circuit cards are known already in various embodiments. The type of printcard closest related to the present invention is comprised of a thin sheet of insulating material, e.g. laminated fiberglass sheet, provided on both sides with a pattern of conductor paths connecting the individual components of the subject circuit, such as resistors, capacitors, coils and transistors or tubes, both with respect to one another and to a power network and a zero potential or frame. A commonly employed method of establishing the wiring pattern is known as the photoresist method which is so wellknown that it need not be further discussed. This also applies to the serigraphic method.

The most essential feature of this "photoresist" method is laying out the wiring pattern on a thin transparent film forming the negative of the said photomechanical method. The planning of the wiring pattern is done on a sheet of transparent paper laid over a graph sheet or modular sheet, being usually based on a diagram of the subject circuit, which diagram uses the common standardized component symbols. Such a circuit, e.g. for an amplifier, is often complicated so as to render the print layout or rather the planning of the wiring pattern a cumbersome job which frequently has to be done over again many times before the result is usuable. As is well-known, the difficulties are caused by the fact that no conductor paths may intersect since the wiring pattern is laid out in one plane or, if necessary, in two planes on both sides of the insulating sheet. As a result of this difficulty in providing the necessary connections between the components of a circuit, it is known to utilize the so-called "shunts". In connection with a single print such "shunts" may be established by providing on the insulated side of the printsheet a conductor connected to conductor paths on the metal foil side or, which is equally common, providing on the metal foil side the desired connection by means of an insulated single conductor. This problem is known both in single and double prints, and the solution by means of "shunts" does actually represent an emergency solution.

It is the object of the invention to provide a method of producing multilayer prints, whereby the planning of the wiring pattern and the laying out of the print itself is greatly simplified. This is achieved by a method of the said type which according to the invention is distinguished by the features defined in the characterizing clause of the claim.

This will mean considerable simplification of the conductor paths produced on the individual part prints, which paths may now be laid out directly on the respective film without any extensive planning. The result is a great saving in terms of time and cheaper production seeing that no particular expert knowledge is required for laying out the print. It is merely required to know the physical dimensions of the individual components and the symbolism contained in the diagram. With respect to circuit techniques the advantage obtained is shorter wiring paths in that the division into a plurality of layers does not require conductor paths making substantial "detours". The simultaneous drawing of the position of the components on the transparent drawing paper moreover prevents mistakes in mounting.

Figure 4:
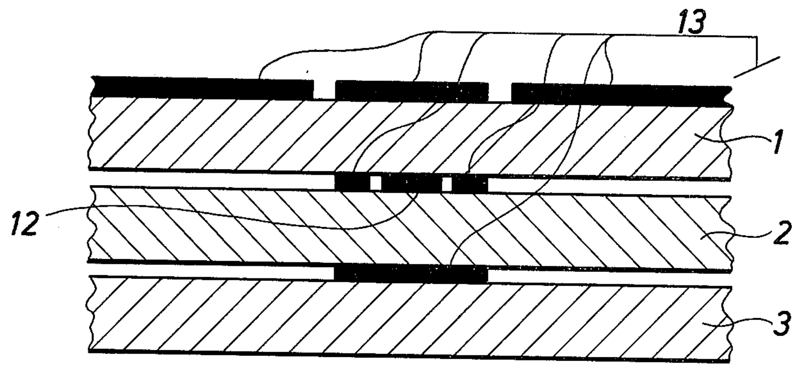
Figure 2:
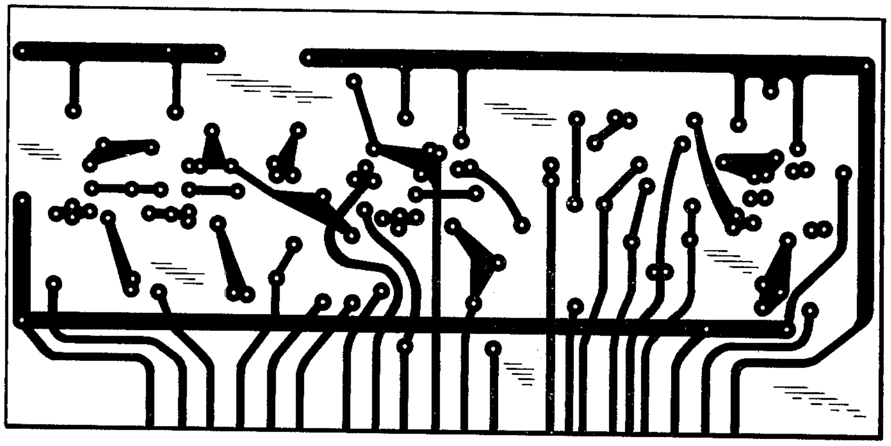

The invention will now be further explained below with reference to the drawings, in which FIG. 1 shows three different films or part prints, FIG. 2 shows the three transparent films or part prints in superimposed relationship, FIG. 3 an example of mounting a pair of discrete components on the circuit card composed of the three part prints, and FIG. 4 an example of providing a shielded conductor when using the method of the present invention.

FIG. 1 illustrates three different part prints the way they appear when laying out a specific circuit. Their appearance may be varied some dependent on how the individual circuit components are positioned in relation to each other, as in that respect one has a rather wide margin. The figures illustrated may be viewed as a representation of the negative films used for developing the wiring patterns on the various metal coatings in conjunction with the initially discussed photoresist and serigraphic method, although other known methods may be used too, and also as a representation of the finished part prints.

Numeral 1 generally signifies a "component print" used to establish electrically conductive connection between the respective circuit components, numeral 2 is generally a "power supply print" used to establish electrically conductive connection between a number of components, both active components and passive components, and one pole of a power source respectively a number of components and common frame point or common zero potential level, and numeral 3 is generally a "connecting print" used to establish electrically conductive connection between the circuit components placed on the print and outer components such as regulating resistors and potentiometers respectively switches, provided these could not be conveniently accomodated on the subject component print.

On the part prints are shown typical "eyelets" 4, some of which are interconnected by conductor paths 5.

The power supply print 2 shows a typical connection to the positive or negative pole or poles 6 of the power source or sources and a typical common frame point 7. It also appears from the figure that the component print 1 and the power supply 2 have less width than the connecting print 3 such that when these three part prints are superimposed there is left space for connecting an edge connector along one edge of the connecting print to which electrically conductive edge connections 8 have been extended. The most advantageous sequence of arranging the part prints is when the component print 1 is at the top, while the power supply print 2 and the connecting print 3 may change places as desired. The aforesaid provision of a tongue to which an edge connector can be connected is necessary only if the part prints have been made on the basis of thick metal foil coated insulating sheets with a thickness of approx. 1.5 mm, the maximum spanning capacity of an edge connector being sheets with a thickness of from 1.5 to 1.65 mm. However, there are commercially available metal foil coated insulating sheets with a thickness of 0.5 mm such that all the sheets may be given identical outside measures. This will facilitate standardization of the part prints with respect to their outside measures.

Figure 3:
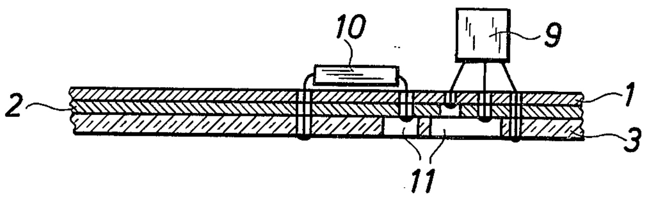

The electrical connections between the part sheets are effected by the circuit components included in the respective circuit, as shown in FIG. 3. Here, the component print 1 is at the top, with depending conductor paths, followed by the power supply print 2, also with depending conductor paths, and finally, the connecting print 3 which is oriented in the same manner as in the case of the preceding two prints. A transistor 9 is shown in the figure and whose three electrodes are soldered onto respective part prints and a resistor 10 whose terminals are soldered onto the two lower part prints. The figure shows the principle of the physical mounting on the composite printcard.

The transparent films are obtained as follows. A sheet of graph paper or modular paper is stretched on a drawing board, and thereon the required number of layers, three in the case of the example described, of transparent film material and a sheet of transparent drawing paper. It is possible in lieu of a drawing board to use also a so-called light box, in which case the graph or modular paper should preferably be transparent. The said layers are conveniently fixed with respect to each other by means of drawing pins or like attachment means along one edge thereof so as to leave access to the underlying layers. Based on an existing circuit diagram and the knowledge of the physical dimensions of the individual components, there is now drawn on the transparent sheet of drawing paper the respective positions of the individual components, taking into due consideration the space available. In respect of each single component the film layers, at the point where the terminals of the components are to be carried through, are pierced, and the film on which the soldering is to be performed is provided with an "eyelet", while the conductor paths between the various "eyelets" are marked by a narrow strip. In this manner one progresses successively through the diagram from one component to the next, taking care when positioning the various "eyelets" that no "eyelets" will be overlapping.

After establishing in this manner the different wiring patterns on the various film layers, the latter are used in conventional manner for producing a wiring pattern on the metal foil coated insulating sheets. To obtain accurate control of the position of the sheets with respect to each other, the films are provided with registering marks capable of forming the corners of a triangle. The larger the triangle, the better the control of the sheets. After completing the etching operation of the sheets, these are pierced at the aforesaid three corner points to enable the sheets, guided by three pins, to be clamped together in proper relation to each other. Following this, all the sheets are pierced in conventional manner through the "eyelets" through which the terminals of the components are to be passed, and there are provided openings in the underlying sheets at the points where the terminals of the components are to be soldered onto interposed conductive layers, in the manner shown at 11 in FIG. 3. When all such exposed points have been established and the individual components have been loosely mounted on the card, the soldering of the components onto the part prints may advantageously be effected by means of immersion soldering, the part prints being so tightly clamped together as to prevent tin solder from flowing in between, allowing it to adhere only to the points where there is already an exposed "eyelet" of copper. Obviously, in addition to immersion soldering, other known soldering methods could be used.

While the invention has been illustrated and described with particular reference to one single embodiment thereof, it will be appreciated that various modifications with respect to form and details may be made. If it is desired, for example, that the circuit card should have good HF characteristics, it is possible, of course, in lieu of narrow conductor paths to provide large copper areas of the same potential, whereby said large continuous copper areas are separated from each other only by narrow non-metallic strips, to thereby obtain effective screening between the individual layers forming the circuit card. This will not alter the principles of the method according to the invention.

In high frequency circuits as well as in audio frequency circuits shielded (or screened) conductors are utilized to establish "critical" connections. Such a shielded conductor may be provided in a simple manner when using the method of the present invention. This is illustrated in FIG. 4.

Here the same three part prints are shown as in FIG. 3, where the upper part print, however, is made of an insulating sheet covered by metal foils on both sides. The so-called "hot" conductor, which is to be shielded, is designated by reference numeral 12, while the insulated conductor paths relative to the said hot conductor or greater conductive areas, which may be situated both above and beneath as well as on both sides of the hot conductor 12, are in common designated by reference numeral 13, and shown connected to the frame or another appropriate zero potential.

I claim:

1. A method of forming a printed circuit in the form of a multilayer board on the basis of an existing schematic diagram of an electrical circuit, the layout of the wiring patterns of the individual layers of the multilayer boards comprising the steps of disposing over a light table in the following order, a precision grid, three transparent sheets and a sheet of tracing paper, one transparent sheet serving as a master for a "component" layer of the multilayer board, the second serving as a master for a "power supply" layer of the multilayer board, and the third serving as a master for an "interconnections" layer of the multilayer board; mutually fixing said sheets so that each one is easily accessible; positioning on appropriate ones of the transparent sheets solder pads for the terminals of the individual components forming the circuit, markings of passage holes, and interconnecting conductor paths in accordance with said schematic diagram, starting at an input end of the diagram and working step by step throughout the diagram, considering simultaneously said three layers of the multilayer board; concurrently drawing the component images on the tracing paper at positions corresponding to the positions of the associated solder pads on the transparent sheets; and finally employing the completed masters when transferring the wiring patterns from the masters to the individual layers of the multilayer board.

* * * * *